United States Patent  
Iyer et al.

US 6,340,637 B2  
Jan. 22, 2002

(54) CHEMICAL VAPOR DEPOSITION OF TITANIUM FROM TITANIUM TETRACHLORIDE AND HYDROCARBON REACTANTS

(75) Inventors: Ravi Iyer; Sujit Sharan, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/730,038

(22) Filed: Dec. 5, 2000

Related U.S. Application Data

(63) Continuation of application No. 09/292,993, filed on Apr. 16, 1999, now Pat. No. 6,184,136, which is a continuation of application No. 08/581,765, filed on Jan. 2, 1996, now Pat. No. 5,946,594.

(51) Int. Cl.[7] ................................................. H01L 21/44  
(52) U.S. Cl. ..................... 438/685; 438/680; 438/683; 438/648; 427/250; 427/255.11  
(58) Field of Search ................................. 438/685, 680, 438/681, 683, 648, 676; 427/250, 255.11, 255.2, 253

(56) References Cited

U.S. PATENT DOCUMENTS

| | | | |
|---|---|---|---|
| 4,925,813 A | 5/1990 | Autier et al. | |
| 5,052,339 A | 10/1991 | Vakerlis et al. | |
| 5,094,711 A | 3/1992 | Narasimhan et al. | |
| 5,260,107 A | * | 11/1993 | Kawamura et al. |
| 5,344,792 A | 9/1994 | Sandhu et al. | |
| 5,645,900 A | 7/1997 | Ong et al. | |
| 5,665,431 A | 9/1997 | Narasimhan | |
| 5,846,881 A | 12/1998 | Sandhu et al. | |

\* cited by examiner

Primary Examiner—Caridad Everhart  
(74) Attorney, Agent, or Firm—TraskBritt

(57) ABSTRACT

A new process for depositing titanium metal layers via chemical vapor deposition is disclosed. The process provides deposited titanium layers having a high degree of conformality, even in trenches and contact openings having aspect ratios greater than 1:5. The reaction gases for the improved process are titanium tetrachloride and a hydrocarbon gas, which for a preferred embodiment of the process is methane. The reaction is carried out in a plasma environment created by a radio frequency source greater than 10 KHz. The key to obtaining titanium metal as a reaction product, rather than titanium carbide, is to set the plasma sustaining electrical power within a range that will remove just one hydrogen atom from each molecule of the hydrocarbon gas. In a preferred embodiment of the process, highly reactive methyl radicals ($CH_3$—) are formed from methane gas. These radicals attack the titanium-chlorine bonds of the tetrachloride molecule and form chloromethane, which is evacuated from the chamber as it is formed. Titanium metal deposits an a wafer or other substrate that has been heated to a temperature within a preferred range of 200–500° C.

28 Claims, 1 Drawing Sheet

CHEMICAL VAPOR DEPOSITION OF TITANIUM FROM TITANIUM TETRACHLORIDE AND HYDROCARBON REACTANTS

CROSS REFERENCE TO RELATED APPLICATIONS

This application is a continuation of application Ser. No. 09/292,993, filed Apr. 16, 1999, now U.S. Pat. No. 6,184, 136 B1, issued Feb. 6, 2001, which is a continuation of application Ser. No. 08/581,765, filed Jan. 2, 1996, now U.S. Pat. No. 5,946,594, issued Aug. 31, 1999.

BACKGROUND OF THE INVENTION

1. Field of the Invention

This invention relates to chemical vapor deposition reactions, integrated circuit manufacturing and, more particularly, to methods for depositing titanium metal layers on in-process integrated circuits.

2. Background of Related Art

Deposited titanium metal layers are being used with increasing frequency in integrated circuits. One important application involves the formation of contact structures within a dielectric layer. The processing of wafers for the manufacture of integrated circuits commonly requires that contact openings be etched through an insulative layer down to implant or diffusion regions in a semiconductor layer to which electrical contact is to be made. Titanium metal is then deposited over a wafer so that the surface of each exposed implant/diffusion region is coated. The titanium metal is eventually converted to titanium silicide. A silicide is a binary compound formed by the reaction of silicon with the metal at elevated temperatures. The titanium silicide layer serves as an excellent conductive interface at the surface of the implant/diffusion region. A titanium nitride barrier layer is then deposited, coating the walls and floor of the contact opening. The contact plugs are formed by depositing a tungsten or polysilicon layer via chemical vapor deposition. In the case of tungsten, the titanium nitride layer provides greatly improved adhesion between the walls of the opening and the tungsten metal. In the case of the polysilicon, the titanium nitride layer acts as a barrier against dopant diffusion from the polysilicon layer into the diffusion region.

Deposited titanium metal layers are also used as an underlayment for aluminum alloy layers deposited on inter-level dielectric layers. The titanium and aluminum alloy layer stack is etched to form interconnect lines within the integrated circuit. The titanium metal layer not only provides increased resistance to electromigration of aluminum atoms, but also provides improved adhesion of the aluminum alloy layer to the dielectric layer as compared with an aluminum alloy layer without the titanium underlayment.

Two principal techniques are presently available for creating thin titanium films: deposition via reactive sputtering of a titanium target and chemical vapor deposition. When topography is present, reactive sputtering results in titanium films having poor step coverage. Although collimated sputtering improves the coverage on trench floors, it does not help coverage on vertical surfaces. In fact, as trench aspect ratios (the ratio of depth to width) exceed 4 or 5 to 1, the deposition rate at the bottom of the trench is minimal because of the buildup of deposited metal at the mouth of the trench. As the mouth of the trench narrows during the deposition process, the corners of the trench floor receive increasingly less deposited material. Because of the step-coverage problem, sputter-deposited films are limited primarily to underlayment layers on relatively planar surfaces. Another problem related to collimated sputtering is that the collimator grid dramatically slows the deposition rate and must be cleaned frequently.

Chemical vapor deposition processes have an important advantage over sputter deposition techniques in that the deposited layers have much higher conformality (i.e., uniform thickness on both horizontal and vertical surfaces), layers of any thickness may be deposited, and the deposition rate does not slow with time (as with collimated sputtering). This is especially advantageous in modem ultra-large-scale-integration (ULSI) circuits, where minimum feature widths may be smaller than 0.3 $\mu$m and trenches and contact openings may have width-to-depth aspect ratios of 1:5 or more. In U.S. Pat. No. 5,173,327, a chemical vapor deposition process for titanium is disclosed. Titanium tetrachloride and hydrogen gas are admitted to a chemical vapor deposition chamber in which a substrate (i.e., semiconductor wafer) has been heated to about 400° C. Titanium tetrachloride molecules are adsorbed on the substrate surface and react with hydrogen with the following chemical equation: $TiCl_4 + 2H_2 = Ti + 4HCL$. The deposition rate of this reaction can be enhanced by striking a radio-frequency plasma in the deposition chamber. Because the diatomic hydrogen molecule is relatively difficult to ionize, the flow rate of hydrogen gas into the deposition chamber must be considerably greater than that for titanium tetrachloride.

The low ratio of titanium tetrachloride molecules to hydrogen molecules is not conducive to high deposition rates. In addition, as the aspect ratio of trenches and contact openings increases, step-coverage worsens due to the limited amount of titanium tetrachloride that is adsorbed toward the bottom of the trenches and contact openings. Although the aforementioned titanium deposition process is satisfactory for many applications, the present invention aims at providing a chemical vapor deposition process for titanium having increased conformality and more rapid deposition rates.

BRIEF SUMMARY OF THE INVENTION

This invention is embodied in a new process for depositing titanium metal layers via chemical vapor deposition. The process provides deposited titanium layers having a high degree of conformality, even in trenches and contact openings having aspect ratios greater than 1:5. The reaction gases for the improved process are titanium tetrachloride and a hydrocarbon gas, which for a preferred embodiment of the process is methane. The chemical reaction is as follows:

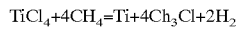
$$TiCl_4 + 4CH_4 = Ti + 4Ch_3Cl + 2H_2$$

The reaction is carried out in a plasma environment created by a radio frequency AC source greater than 10 KHz. The standard FCC-assigned frequencies of 400 KHz and 13.56 MHz are entirely satisfactory. The key to obtaining the proper reaction products (i.e., titanium metal rather than titanium carbide) is to set the plasma-sustaining electrical power within a range that will break just one hydrogen bond from the hydrocarbon gas. In the case of methane, highly reactive methyl radicals ($CH_3$—) are formed. These radicals attack the titanium-chlorine bonds of the tetrachloride molecule and form chloromethane, which is evacuated from the chamber as it is formed. In the case of other hydrocarbon gases, highly reactive alkyl radicals are formed. The alkyl radicals attack the titanium tetrachloride and form an alkyl chloride gas which is evacuated from the chamber.

DETAILED DESCRIPTION OF THE INVENTION

Figure 1:
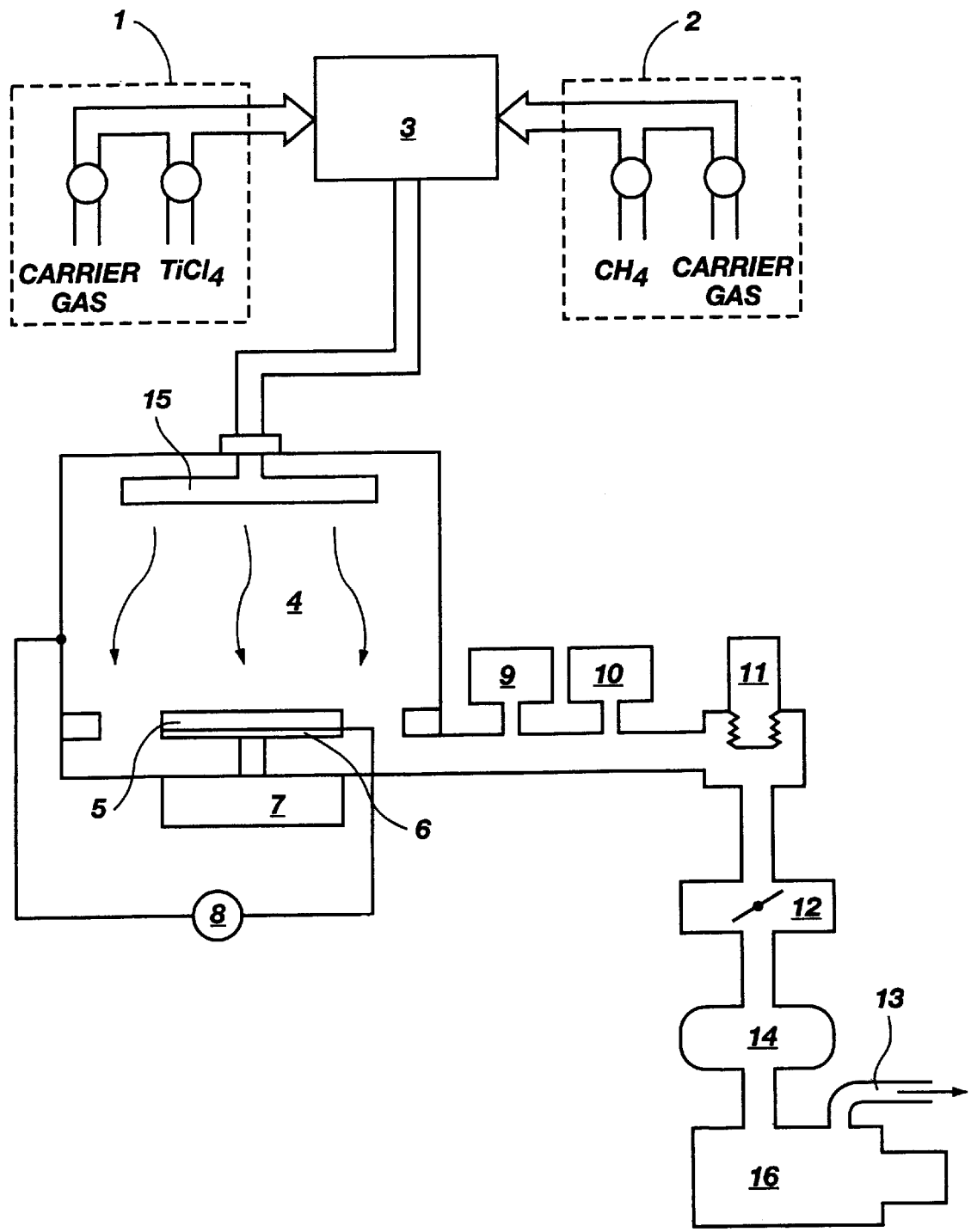
FIG. 1 is a diagrammatical view of a pressurized, chemical vapor deposition chamber showing an arrangement for the introduction of the reactants of the new chemical vapor deposition process for titanium metal.

This new process for depositing titanium metal layers via chemical vapor deposition provides titanium layers having a high degree of conformality, even in trenches and contact openings having width-to-depth aspect ratios greater than 1:5. The reaction gases for the improved process are titanium tetrachloride ($TiCl_4$) and a hydrocarbon gas, which for a preferred embodiment of the process is methane ($CH_4$). Other hydrocarbon gases having the general formulas $C_nH_{2n+2}$, $C_nH_{2n}$ and $C_nH_{2n-2}$ are also potential candidates.

The chemical reaction of the preferred embodiment of the process, which employs methane gas, is as follows:

$$TiCl_4 + 4CH_4 = Ti + 4CH_3Cl + 2H_2$$

The reaction is carried out in a plasma environment created by a radio frequency AC source greater than 10 KHz. The standard FCC-assigned frequencies of 400 KHz and 13.56 MHz are entirely satisfactory for carrying out the reaction. The key to obtaining the proper reaction products (i.e., titanium metal rather than titanium carbide) is to set the plasma sustaining electrical power within a range that will break just one hydrogen bond of the hydrocarbon gas molecules. In other words, the power setting is maintained at a level that is greater than the first ionization energy, but less than the second ionization energy for the selected hydrocarbon gas or gases. A power range of about 20 to 100 watts meets this requirement when methane is selected as the reactant hydrocarbon gas. It may be necessary to adjust both the power setting and the AC source frequency when other hydrocarbon gases are used. By breaking just one hydrogen bond in the methane molecule, highly reactive methyl radicals ($CH_3$—) are formed. These radicals attack the titanium-chlorine bonds of the tetrachloride molecule and form chloromethane, which is evacuated from the chamber as it is formed. In the case of other hydrocarbon gases, highly reactive alkyl radicals are formed. The alkyl radicals attack the titanium tetrachloride and form an alkyl chloride gas which is evacuated from the chamber.

The process will now be described in reference to the diagrammatic representation of the plasma-enhanced chemical vapor deposition (PECVD) chamber of FIG. 1. Although the following description of the process represents what the inventors believe is the preferred embodiment of the process, the process may be practiced in either cold-wall or hot-wall plasma-enhanced chemical vapor deposition chambers, with or without premixing of the reactants. Furthermore, although the invention is directed to a technique for depositing conformal titanium layers for use in the manufacture of integrated circuits, the process is also applicable to the deposition of titanium on substrates other than semiconductor wafers. Referring now to FIG. 1, a titanium tetrachloride ($TiCl_4$) source gas is produced by heating liquid $TiCl_4$. The gas phase $TiCl_4$ is admitted into a premixing chamber 3 through control valve 1 and a hydrocarbon gas such as methane $CH_4$ is admitted into the premixing chamber 3 through control valve 2. Following the premixing of the gas phase $TiCl_4$ and the $CH_4$ in premixing chamber 3, the premixed gases are admitted to the deposition chamber 4. Optionally, the gas-phase $TiCl_4$ or the hydrocarbon gas, or both, may be mixed with a carrier gas such as argon (Ar) or helium (He). For example, helium gas may be bubbled through the heated $TiCl_4$ to further enhance the complete gasification of that reactant, while argon gas might be added to the hydrocarbon gas in order to dilute that reactant and/or set a desired deposition pressure. As a further option, liquid $TiCl_4$ may be converted to a fine spray or mist by a liquid injector (not shown). The mist is then passed through a vaporizer chamber (also not shown) en route to the deposition chamber. The flow rate of the hydrocarbon gas in standard cubic centimeters per minute (scc/m) should be four to about 1,000 times that for the $TiCl_4$. Within the deposition chamber, a semiconductor wafer 5 is heated by convection from substrate holder 6 (such as a graphite or alumina boat) that in turn is heated to a preferred temperature of 200 to 500° C. via halogen lamps 7. The walls of the chamber are maintained at a temperature which will prevent condensation of titanium tetrachloride thereon. By maintaining the wafer at a temperature that is considerably higher than the chamber walls, deposition of titanium metal on the walls can be minimized. The temperature of the chamber walls should be maintained within a range of about 50–400° C., and optimally within a range of about 100–200° C.

Still referring to FIG. 1, the premixed gas combination of $TiCl_4$ and the hydrocarbon gas enters deposition chamber 4 through shower head 15. A radio-frequency voltage, supplied by radio-frequency generator 8, is applied between substrate holder 6 and deposition chamber 4, thus forming alkyl radicals from the hydrocarbon gas in the space above the semiconductor wafer 5. The $TiCl_4$ is adsorbed on the surface of the semiconductor wafer 5, and alkyl radicals react with the adsorbed $TiCl_4$ molecules to deposit a uniformly thick titanium metal layer on all exposed surfaces of the wafer. As high temperatures favor the formation of inorganic halides as opposed to titanium metal, the reaction temperature is maintained within a range of about 200° C. to 500° C. Although the desired reaction will occur at a pressure within a range of about 2 to 100 torr, a preferred range is deemed to be about 2 to 5 torr. A constant deposition pressure within that preferred range is monitored and maintained by conventional pressure control components consisting of pressure sensor 9, pressure switch 10, air operating vacuum valve 11 and pressure control valve 12. The alkyl chloride gas given off as a byproduct of the reaction, whether methyl chloride ($CH_3Cl$) or an alkyl chloride, and the carrier gases (if carrier gases are used) pass through particulate filter 16 and escape through exhaust vent 14 with the aid of a Roots blower 13 to complete the process.

It is to be understood that although the present invention has been described with reference to a preferred embodiment, various modifications known to those skilled in the art may be made to the process steps presented herein without departing from the scope and spirit of the invention as hereinafter claimed.

What is claimed is:

1. A chemical vapor deposition process for depositing a metal layer on a substrate, comprising:

placing the substrate within a plasma-enhanced deposition chamber;

admitting titanium tetrachloride and at least one hydrocarbon gas into said deposition chamber;

providing a plasma maintained at a power level sufficient to form radicals therein, said plasma having a power level greater than a first ionization energy, but less than a second ionization energy, of the at least one hydrocarbon gas for forming hydrocarbon radicals; and heating the substrate to a temperature sufficient to induce the hydrocarbon radicals to react with chlorine atoms from the titanium tetrachloride leaving titanium metal atoms on at least a portion of a surface of the substrate.

2. The process of claim 1, wherein the substrate is heated to a temperature within a range of 200–500° C.

3. The process of claim 1, wherein said at least one hydrocarbon gas is selected from a group consisting of compounds $C_nH_{2n+2}$, $C_nH_{2n}$ and $C_nH_{2n-2}$.

4. The process of claim 1, wherein said at least one hydrocarbon gas is an alkane having fewer than five carbon atoms per molecule.

5. The process of claim 4, wherein said at least one hydrocarbon gas is methane.

6. The process of claim 1, further comprising:

mounting said substrate on a susceptor;

heating said susceptor; and heating said substrate using said susceptor.

7. The process of claim 1, wherein said titanium tetrachloride is mixed with a carrier gas selected from a group consisting of helium, argon and hydrogen.

8. The process of claim 7, wherein the titanium tetrachloride is introduced into said carrier gas in a bubbler apparatus.

9. The process of claim 7, wherein a liquid injector sprays said titanium tetrachloride, said spray being passed through a vaporizer.

10. The process of claim 1, wherein said at least one hydrocarbon gas is mixed with a carrier gas selected from a group consisting of helium and argon.

11. The process of claim 1, wherein nondepositing reaction products are removed from the deposition chamber as the process proceeds.

12. The process of claim 11, wherein an alkyl chloride gas is a principal reaction product.

13. The process of claim 1, wherein said deposition chamber is a cold wall deposition chamber, walls of which are maintained at a temperature within a preferred range of about 100° C. to about 200° C. for preventing condensation of the titanium tetrachloride thereon.

14. The process of claim 1, wherein said deposition chamber includes a hot wall deposition chamber.

15. The process of claim 1, wherein said plasma includes a plasma produced using a radio frequency source.

16. The process of claim 15, wherein said radio frequency source operates at a power setting within a range of about 20 to about 100 watts.

17. The process of claim 15, wherein said radio frequency source operates at a frequency greater than about 10 KHz.

18. The process of claim 1, wherein said deposition chamber includes a deposition chamber maintained at a pressure within a range of about 2 to about 100 torr.

19. The process of claim 1, wherein said deposition chamber includes a deposition chamber maintained at a pressure within a range of about 2 to about 5 torr.

20. The process of claim 1, wherein the titanium tetrachloride and the at least one hydrocarbon gas are premixed before being admitted to the deposition chamber.

21. The process of claim 20, wherein a ratio of hydrocarbon gas to titanium tetrachloride in the premixture is in the range of between four and one thousand to one.

22. The process of claim 1, wherein said substrate is a semiconductor wafer.

23. A chemical vapor deposition process for depositing a metal layer on a semiconductor wafer comprising:

placing the semiconductor wafer within a plasma-enhanced deposition chamber;

admitting titanium tetrachloride and at least one hydrocarbon gas into said deposition chamber;

forming a plasma within said plasma-enhanced deposition chamber;

maintaining said plasma at a power level greater than the first ionization energy, but less than the second ionization energy, of the at least one hydrocarbon gas, forming hydrocarbon radicals; and heating the semiconductor wafer to a temperature sufficient to induce the hydrocarbon radicals to react with chlorine atoms from the titanium tetrachloride molecules forming chlorinated hydrocarbon molecules and leaving titanium metal atoms on a surface of the semiconductor wafer.

24. The process of claim 23, wherein the deposition chamber is maintained at a pressure within a range of 2 to 10 torr.

25. The process of claim 23, wherein said power level comprises a radio frequency source operating at a power setting within a range of 20 to 100 watts and at a frequency greater than 10 KHz.

26. The process of claim 23, wherein the titanium tetrachloride and the at least one hydrocarbon gas are premixed prior to their admission to the deposition chamber, having a ratio of methane gas to titanium tetrachloride in the premixture being between four and one thousand to one.

27. The process of claim 23, wherein the at least one hydrocarbon gas is methane.

28. The process of claim 23, wherein said at least one hydrocarbon gas is selected from a group consisting of compounds $C_nH_{2n+2}$, $C_nH_{2n}$ and $C_nH_{2n-2}$.

* * * * *

UNITED STATES PATENT AND TRADEMARK OFFICE
CERTIFICATE OF CORRECTION

PATENT NO.     : 6,340,637 B2
DATED          : January 22, 2002
INVENTOR(S)    : Ravi Iyer and Sujit Sharan It is certified that error appears in the above-identified patent and that said Letters Patent is hereby corrected as shown below:

<u>Title page,</u>
Item [57], ABSTRACT,
Lines 11-12, change "plasma sustaining" to -- plasma-sustaining --
Line 19, after "deposits" change "an" to -- on --

<u>Column 1</u>
Line 67, change "comers" to -- corners --

<u>Column 2,</u>
Line 13, change "modem" to -- modern --

<u>Column 4,</u>
Line 47, change "14" to -- 13 --
Line 48, change "13" to -- 14 --

<u>Column 6,</u>
Lines 20 and 21, after "than" change "the" to -- a --

Signed and Sealed this

Twenty-second Day of April, 2003

JAMES E. ROGAN
*Director of the United States Patent and Trademark Office*